United States Patent [19]
Suzuki

[11] Patent Number: 6,081,480
[45] Date of Patent: *Jun. 27, 2000

[54] SEMICONDUCTOR INTEGRATED CIRCUIT

[75] Inventor: Yukio Suzuki, Tokyo, Japan

[73] Assignee: Seiko Instruments, Inc., Tokyo, Japan

[*] Notice: Under 35 U.S.C. 154(b), the term of this patent shall be extended for 931 days.

[21] Appl. No.: 08/483,839

[22] Filed: Jun. 15, 1995

Related U.S. Application Data

[63] Continuation of application No. 08/229,155, Apr. 18, 1994, abandoned.

[30] Foreign Application Priority Data

Apr. 21, 1993 [JP] Japan .................................. 5-094676

[51] Int. Cl.$^7$ ................................................ G11C 8/00
[52] U.S. Cl. ........................................ 365/236; 365/233
[58] Field of Search ................................. 365/236, 233, 365/195

[56] References Cited

U.S. PATENT DOCUMENTS

| | | | |
|---|---|---|---|
| 4,873,666 | 10/1989 | Lefebvre et al. | 365/236 |
| 4,873,667 | 10/1989 | Geadah et al. | 365/236 |
| 5,255,241 | 10/1993 | Stern et al. | 365/195 |
| 5,270,981 | 12/1993 | Sumi | 365/236 |

*Primary Examiner*—A. Zarabian
*Attorney, Agent, or Firm*—Hogan & Hartson LLP

[57] ABSTRACT

Writing of unwanted data is inhibited if signals other than a required number of clocks are applied for a program for a memory.

A program control circuit 1 delivers a write-starting instruction. A clock number-detecting circuit 2 for detecting a given number of clocks necessary for a program for a memory produces an output signal to the program control circuit 1.

2 Claims, 2 Drawing Sheets

SEMICONDUCTOR INTEGRATED CIRCUIT

This is a continuation of application Ser. No. 08/229,155 filed on Apr. 18, 1994, now abandoned.

BACKGROUND OF THE INVENTION

The present invention relates to a semiconductor integrated circuit having a program control circuit for writing data into a serial EEPROM.

In a known method of exchanging signals between a CPU and a serial EEPROM, the CPU sends a chip-select signal CS, a serial clock signal SK, and memory write data DI to the EEPROM, while the EEPROM sends memory readout data DO to the CPU, as shown in FIG. 2.

With the prior art method, if the CPU gets out of control, signals more than the number of clocks necessary for the memory program are transferred to the EEPROM. As a result, unwanted data is written to the memory.

In order to solve this problem with the prior art techniques, it is an object of the present invention to prevent erroneous writing by ignoring writing instructions when signals other than a given number of clocks necessary for a program are entered.

SUMMARY OF THE INVENTION

To solve the above problem, the present invention is so configured that a clock number-detecting circuit for detecting a given number of clocks necessary for issuing a program instruction produces an output signal to a program control circuit that delivers a write-starting instruction.

In the circuit constructed as described above, the program control circuit is enabled by the output signal from the clock number-detecting circuit only if the given number of clocks necessary for the program for the memory are sent. If the number of the clocks is different from the required number, the program control circuit is disabled, so that writing is inhibited.

DETAILED DESCRIPTION OF THE PREFERRED EMBODIMENTS

Figure 1:
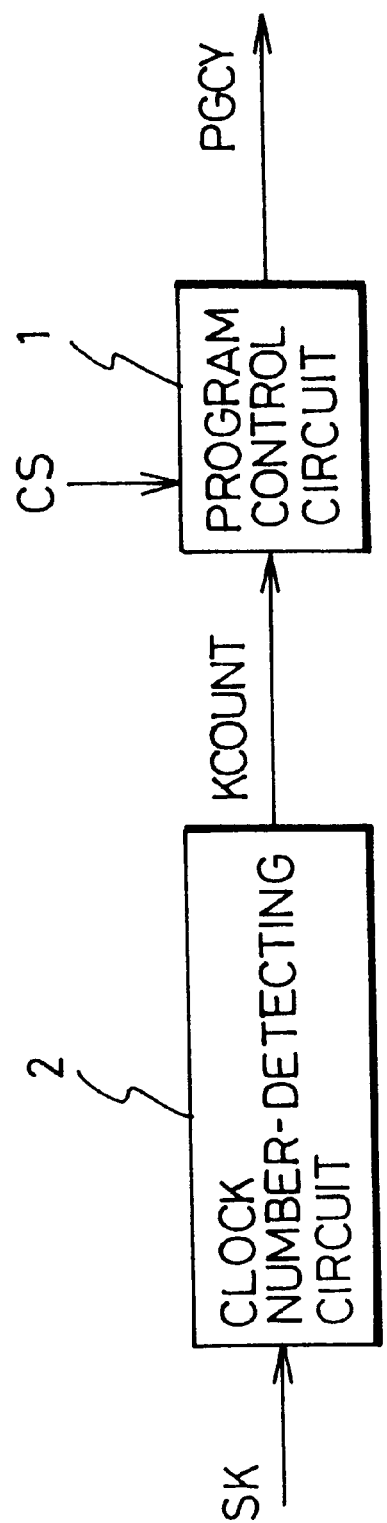
FIG. 1 is a block diagram of a semiconductor integrated circuit according to the present invention.
Figure 2:
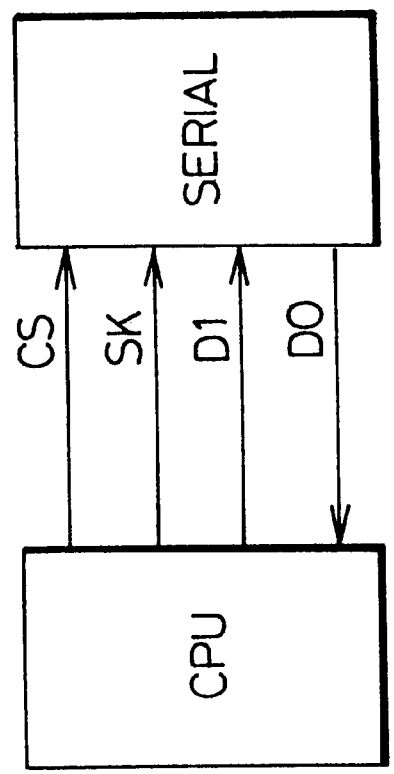
FIG. 2 is a block diagram of the prior art semiconductor integrated circuit.

An embodiment of the present invention is described hereinafter by referring to the drawings.

FIG. 1 is an embodiment of the present invention. When a program control circuit 1 is enabled, it delivers a write-starting signal PGCY at a falling trigger of a chip select signal CS. A clock number-detecting circuit 2 sets its output KCOUNT high and enables the program control circuit 1 only if the number of clocks (e.g., 16 clocks) necessary for the program are applied.

Figure 3A:
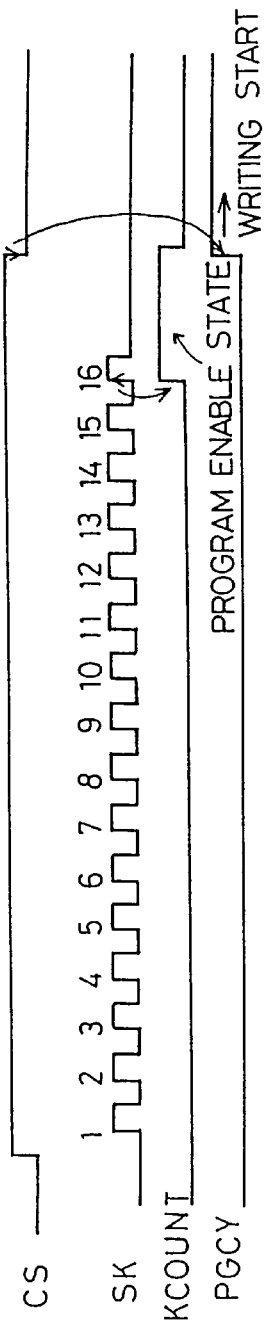
FIG. 3A is a timing chart illustrating the case in which a given number of clocks are entered.

As shown in the time chart of FIG. 3A, if the required 16 clocks are sent as a serially input pulse train to serial clock SK, then KCOUNT signal rises and enables the program control circuit 1. At this time, the CS falls, thus causing the PGCY to rise. Thus, writing is started.

Figure 3B:
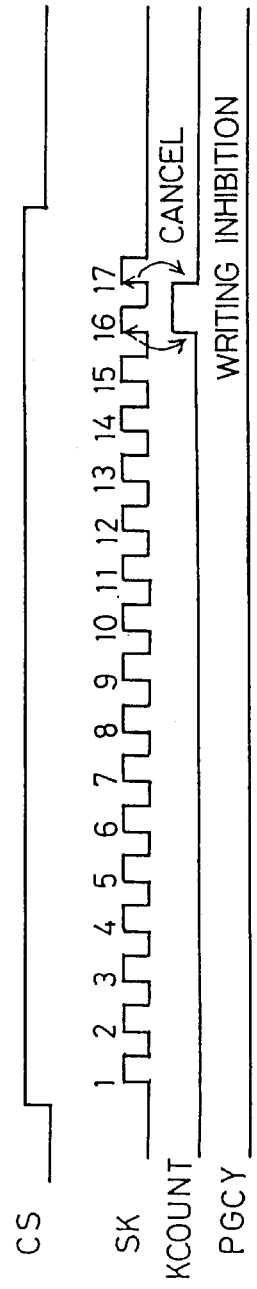
FIG. 3B is a timing chart illustrating the case in which a given number of clocks are not entered.

However, if the number of sent clocks (e.g., 17 clocks) is different from the required number of clocks as shown in FIG. 3B, then the KCOUNT is at low level and the program control circuit 1 is disabled when the CS falls. Hence, writing is not started.

Figure 3C:
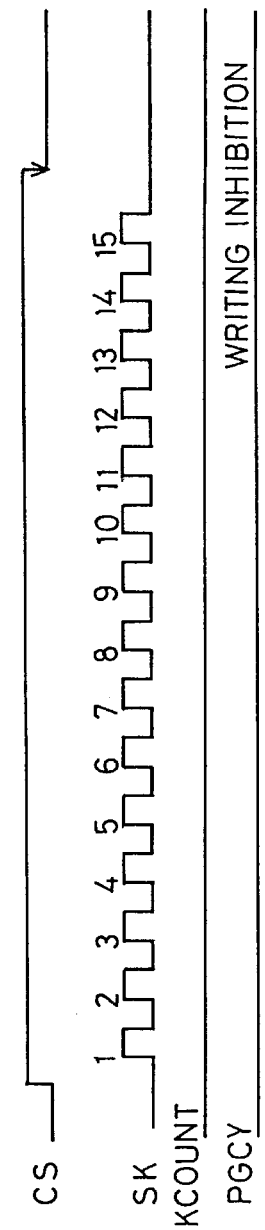
FIG. 3C is a timing chart illustrating the case in which a given number of clocks are not entered.

When the number of sent clocks (e.g. 15 clocks) is different from the required number of clocks as shown in FIG. 3C, then the KCOUNT is at low level and the program control circuit 1 is disabled when the CS falls. Hence, writing is not started.

As described thus far, in the present invention, a program for a memory is executed only if a given number of clocks necessary for the program are entered into the memory; otherwise writing of unwanted data, i.e., erroneous writing, is inhibited.

What is claimed is:

1. A semiconductor integrated circuit comprising:

a clock number-detecting circuit for detecting a number of clocks of a serially input pulse train, said clock number-detecting circuit having an input port for receiving said serially input pulse train and an output port for providing an output signal having a given form only when the serially input pulse train has a predetermined number of clocks; and a program control circuit for delivering a program instruction to a memory, said program control circuit having a first input port coupled to said clock number-detecting circuit output port for receiving said clock number-detecting circuit output signal, a second input port for receiving a trigger signal and an output port for supplying said program instruction, wherein said program control circuit delivers said program instruction only when the signal received at said first input port has the given form while said trigger signal changes from a first state to a second state to prevent writing error data to the memory.

2. A semiconductor integrated circuit according to claim 1, wherein the clock number-detecting circuit output signal having the given form is an enable signal to said program control circuit, and said program instruction delivered by said program control circuit is a write-starting instruction to the memory.

* * * * *